(12) United States Patent
Isoshima et al.

(10) Patent No.: US 8,432,333 B2
(45) Date of Patent: Apr. 30, 2013

(54) IMAGE DISPLAY (75) Inventors: Nobuyuki Isoshima, Mito (JP); Kohei Miyoshi, Fujisawa (JP); Mika Ri, Yokohama (JP); Seiichi Sekiguchi, Fujisawa (JP); Yutaka Yamada, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 792 days.

(21) Appl. No.: 12/350,351

(22) Filed: Jan. 8, 2009

(65) Prior Publication Data
US 2009/0174626 A1 Jul. 9, 2009

(30) Foreign Application Priority Data
Jan. 9, 2008 (JP) .................................. 2008-001751

(51) Int. Cl.
*G09G 3/20* (2006.01)

(52) U.S. Cl.
USPC .......................................................... 345/55

(58) Field of Classification Search .................. None
See application file for complete search history.

(56) References Cited

U.S. PATENT DOCUMENTS

| 6,104,451 A * | 8/2000 | Matsuoka et al. ............... 349/58 |
| 6,476,883 B1 * | 11/2002 | Salimes et al. ................... 349/58 |
| 7,002,798 B2 * | 2/2006 | Seki et al. ........................ 361/695 |
| 7,570,489 B1 * | 8/2009 | Sun et al. ........................ 361/695 |

FOREIGN PATENT DOCUMENTS

| JP | 11-237844 | 8/1999 |
| JP | 2005-235843 | 9/2005 |

* cited by examiner

*Primary Examiner* — K. Wong
(74) *Attorney, Agent, or Firm* — Antonelli, Terry, Stout & Kraus, LLP.

(57) ABSTRACT

To provide a reliable high brightness and definition image display by inhibiting a possible increase in fan noise and promoting cooling of an upper, hot portion of a display panel module, various boards, and image processing electronic components, an image display includes a flat display panel module, a display surface side cover on a display surface side of the display panel module, a non display surface side cover on a non display surface side of the display panel module, a display driving board, a power supply board, and a cooling fan, wherein a case of the cooling fan is larger than a distance between the display panel module and the non display surface side cover in an area where the cooling fan is installed, and a first end of the case of the cooling fan closer to the non display surface-side cover is positioned above a second end of the case closer to the display panel module.

5 Claims, 11 Drawing Sheets

IMAGE DISPLAY

BACKGROUND OF THE INVENTION

The present invention relates to a large-sized flat panel display, and is preferably applied particularly to a plasma display or the like which needs to efficiently radiate heat from a display panel, various boards, and image processing electronic components.

Large-sized flat panel displays such as plasma displays providing high-brightness and high-definition images have been required. This has led to an increase in the number of image processing electronic components and in the quantity of heat generated by a display panel and various boards. Thus, a challenge for the large-sized flat panel display is to cool these heat generating components. As is well-known, to cope with the increase in the quantity of heat generated by the display panel and the various boards, an exhausting cooling fan is obliquely installed on a ceiling portion of a rear cover to discharge exhaust heat from the display panel module and various boards for cooling. This configuration is described in, for example, JP-A-2005-235843.

Furthermore, as is well-known, the cooling fan is installed between the display panel module and a non-display-surface-side cover so as to allow cooling air to flow upward in a vertical direction. This configuration is described in, for example, JP-A-11-237844.

For the configuration described in JP-A-2005-235843, enough consideration is not made for the temperature distribution of the display panel module, the temperature distribution of air inside a housing, and propagation of noise from the cooling fan. In particular, in this configuration, cooling air sucked into the housing through an opening formed on a lower side of the housing is allowed to flow upward by the action of buoyancy caused by natural convection and by the cooling fan, installed on the ceiling surface of the rear cover. Thus, the temperature distribution of the air inside the housing is formed such that the temperature increases consistently with the height in the housing. Accordingly, the temperature distribution for the display panel module is formed such that the temperature is higher on an upper side of the display panel module and lower on the lower side thereof. The temperature may differ between a top surface and a bottom surface of the display panel module by at least 10° C. In general, the lifetime of the display panel depends on the temperature of an uppermost portion thereof. Thus, when the flow rate of the cooling fan is increased to decrease a temperature of the top surface of the display panel module, the temperature margin of the lower side of the display panel module is wastefully increased. Furthermore, fan noise increases.

On the other hand, the brightness and definition of images provided by image displays have been improved year by year. The resulting tendency is an increase in the number of required image processing electronic components and in the quantity of heat generated by the display panel and a display driving board and the like. In particular, in recent years, a plurality of image processing electronic components may be arranged at an upper end of the display panel module to deal with the increased definition. Heating of the housing thus progresses gradually from the lower side thereof. Consequently, the heated air inside the housing is positioned in the upper part thereof, where the air is likely to be built up. Thus, the configuration in JP-A-2005-235843 provides insufficient heat radiation, possibly causing the temperature of the components to exceed an upper limit value. Moreover, part of the cooling air flowing in from the lower part of the housing or the like may be exhausted to the exterior of the housing by the cooling fan, with the temperature of the cooling air not significantly increased. This may disadvantageously prevent promotion of the heat radiation from the display panel module. Furthermore, an outlet of the cooling fan directly faces the exterior of the housing. Thus, the noise from the fan is likely to propagate to the exterior, preventing an increase in fan noise being inhibited.

Moreover, in the configuration described in JP-A-11-237844, the cooling fan is installed between the display panel module and the non-display-surface-side cover. In some commercially available products, the cooling fan is installed, for example, below a power supply board in a similar direction so as to improve cooling effects. However, for plasma displays and the like, on which a strong requirement for a thickness reduction is placed, a large-sized fan cannot be installed in the housing owing to a restriction on the depth dimension of the housing. This makes it difficult to increase the flow rate of the cooling fan above a currently achieved value to promote the cooling of the components, without increasing the fan noise.

BRIEF SUMMARY OF THE INVENTION

A cooling structure for image displays has been required which effectively cools the display panel module, the various boards, and the image processing electronic components installed at the upper end of the display panel module without increasing the fan noise.

An object of the present invention is to provide a reliable, high-brightness and high-definition image display which solves the above-described problems with the conventional techniques to promote the cooling of the upper, hot portion of the display panel module, the various boards, and the image processing electronic components at the upper end of the display panel module while inhibiting a possible increase in fan noise.

To accomplish the object, the present invention provides an image display comprising a flat display panel module, a display-surface-side cover installed on a display surface side of the display panel module, a non-display-surface-side cover installed on a non-display surface side of the display panel module, a display driving board, a power supply board, and a cooling fan, wherein a case of the cooling fan is larger than a distance between the display panel module and the non-display-surface-side cover in an area in which the cooling fan is installed, and a first end of the case of the cooling fan which is closer to the non-display-surface-side cover is positioned above a second end of the case which is closer to the display panel module (the cooling fan is located at an angle of 30° to 60° to a horizontal plane).

The present invention is unlikely to be restricted by the depth dimension of a housing, thus enabling a fan with a larger diameter to be mounted in the thin housing. As a result, the flow rate of the fan can be increased with a possible increase in noise inhibited. Moreover, a relatively cool flow, which is likely to rise from the lower side of the housing along the non-display-surface-side cover, can be allowed to flow like a jet directly to the upper side of the display panel module, which is in the greatest need for promotion of cooling, and image processing electronic components installed at the upper end of the display panel. Consequently, the cooling can be promoted, providing a reliable, high-brightness and high-definition image display.

Other objects, features and advantages of the invention will become apparent from the following description of the embodiments of the invention taken in conjunction with the accompanying drawings.

DETAILED DESCRIPTION OF THE INVENTION

Figure 1:
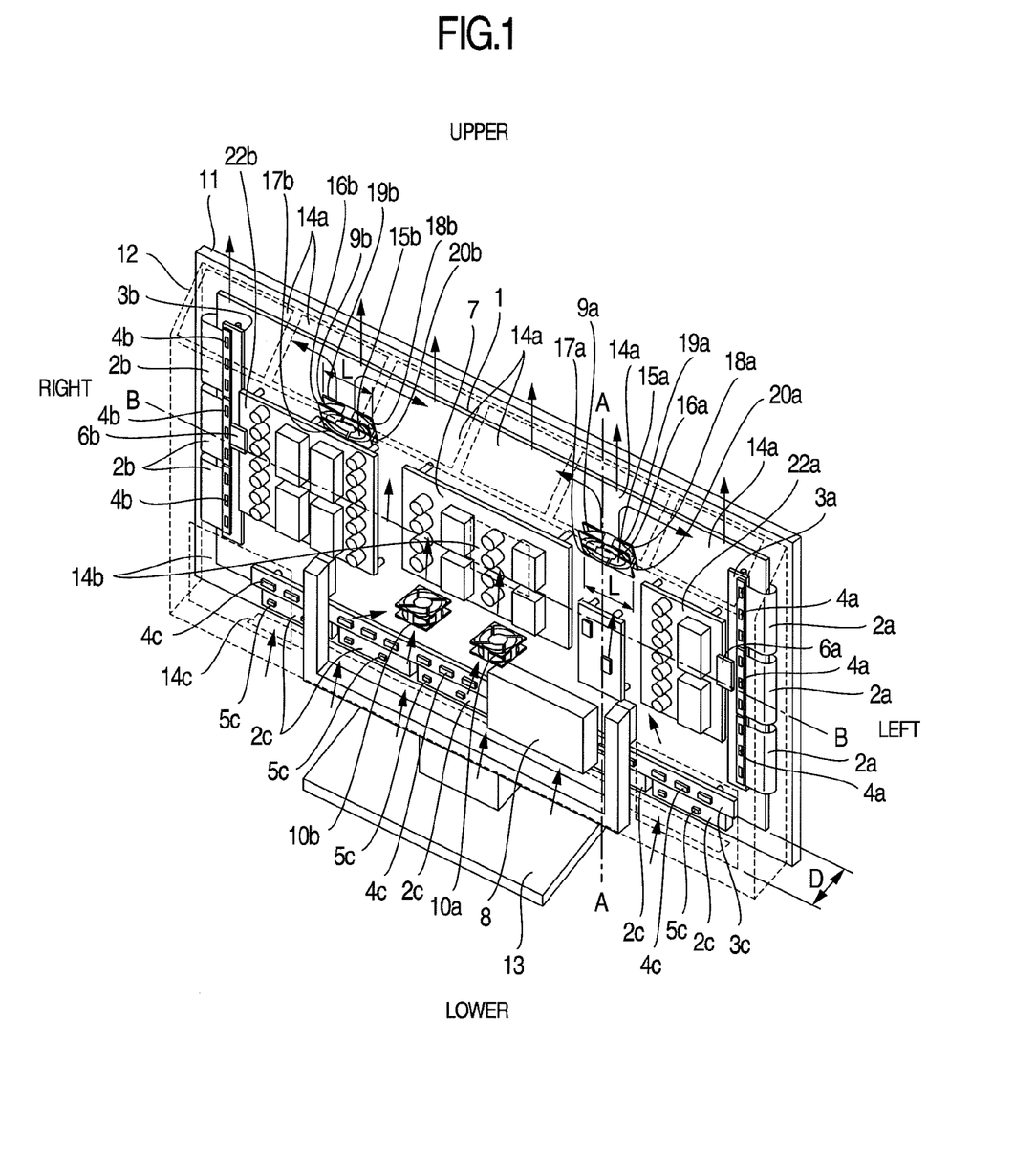
FIG. 1 is a perspective view of appearance of a non-display surface side of an essential part of an image display as a first embodiment of the present invention.
Figure 2:
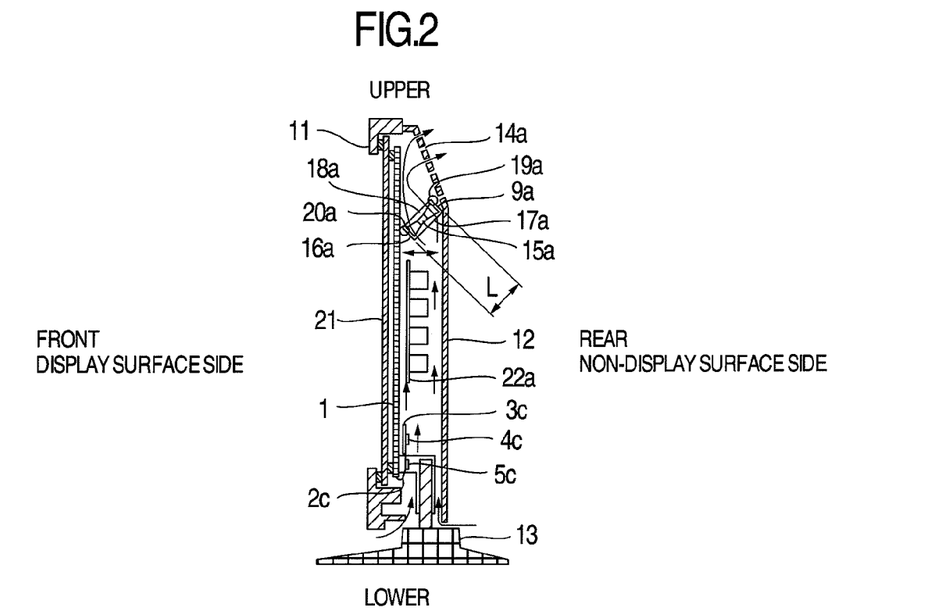
FIG. 2 is a sectional view of a cross section A-A of the image display in FIG. 1 as viewed from a side surface of the image display.
Figure 3:
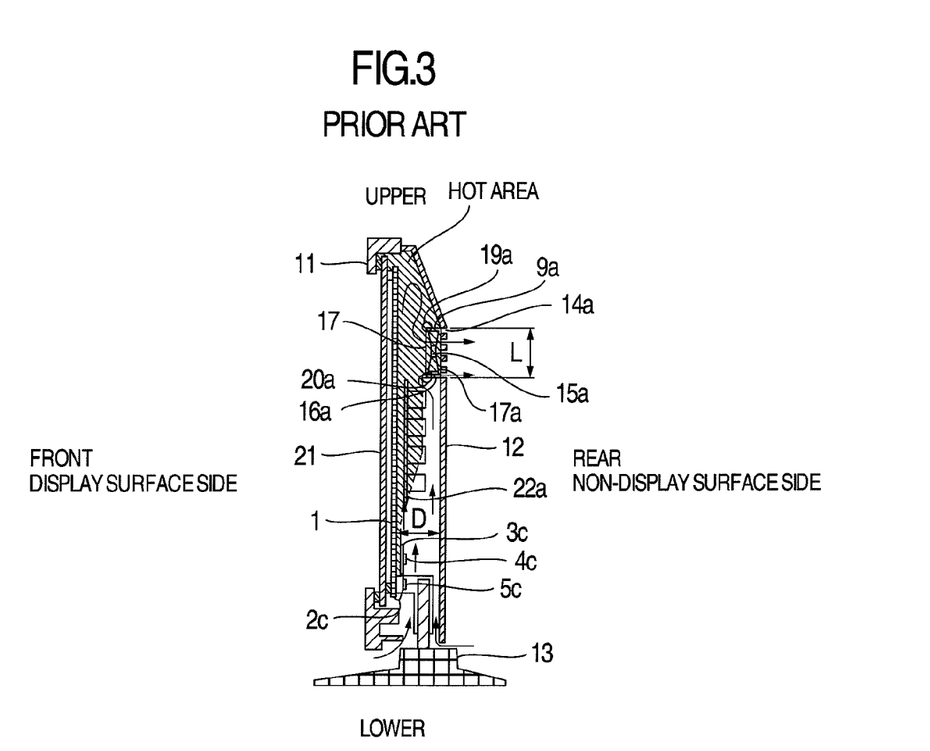
FIG. 3 is a sectional view of a conventional structure corresponding to the cross section A-A in FIG. 1.
Figure 4:
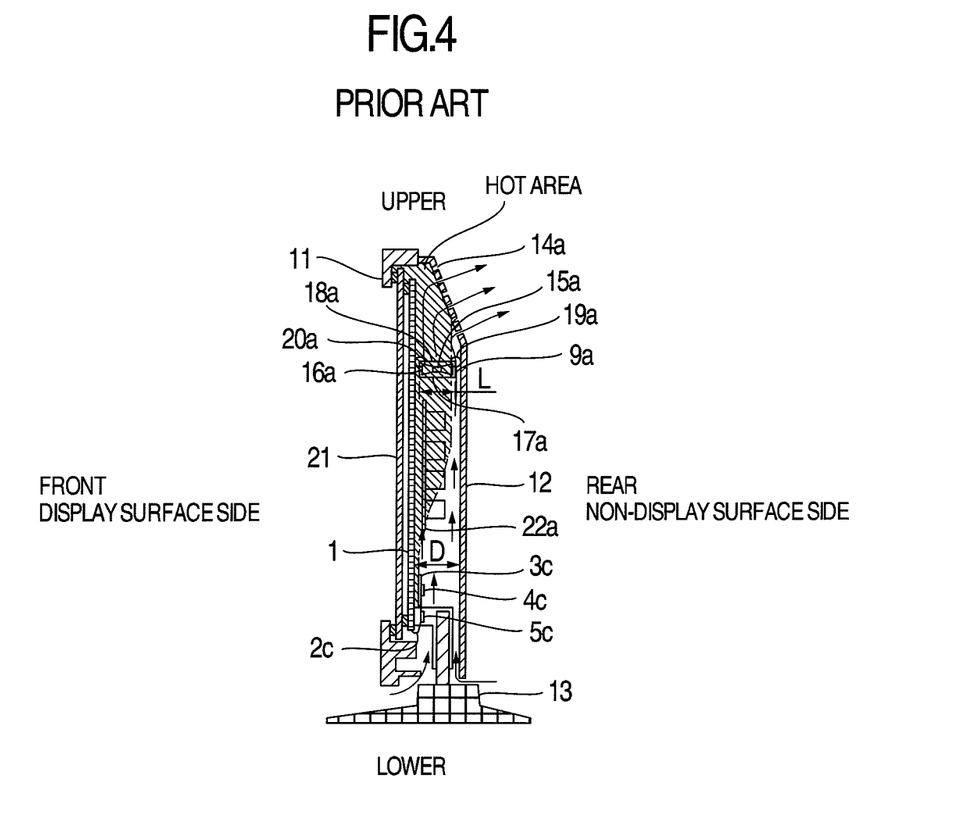
FIG. 4 is a sectional view of another conventional structure corresponding to the cross section A-A in FIG. 1.
Figure 5:
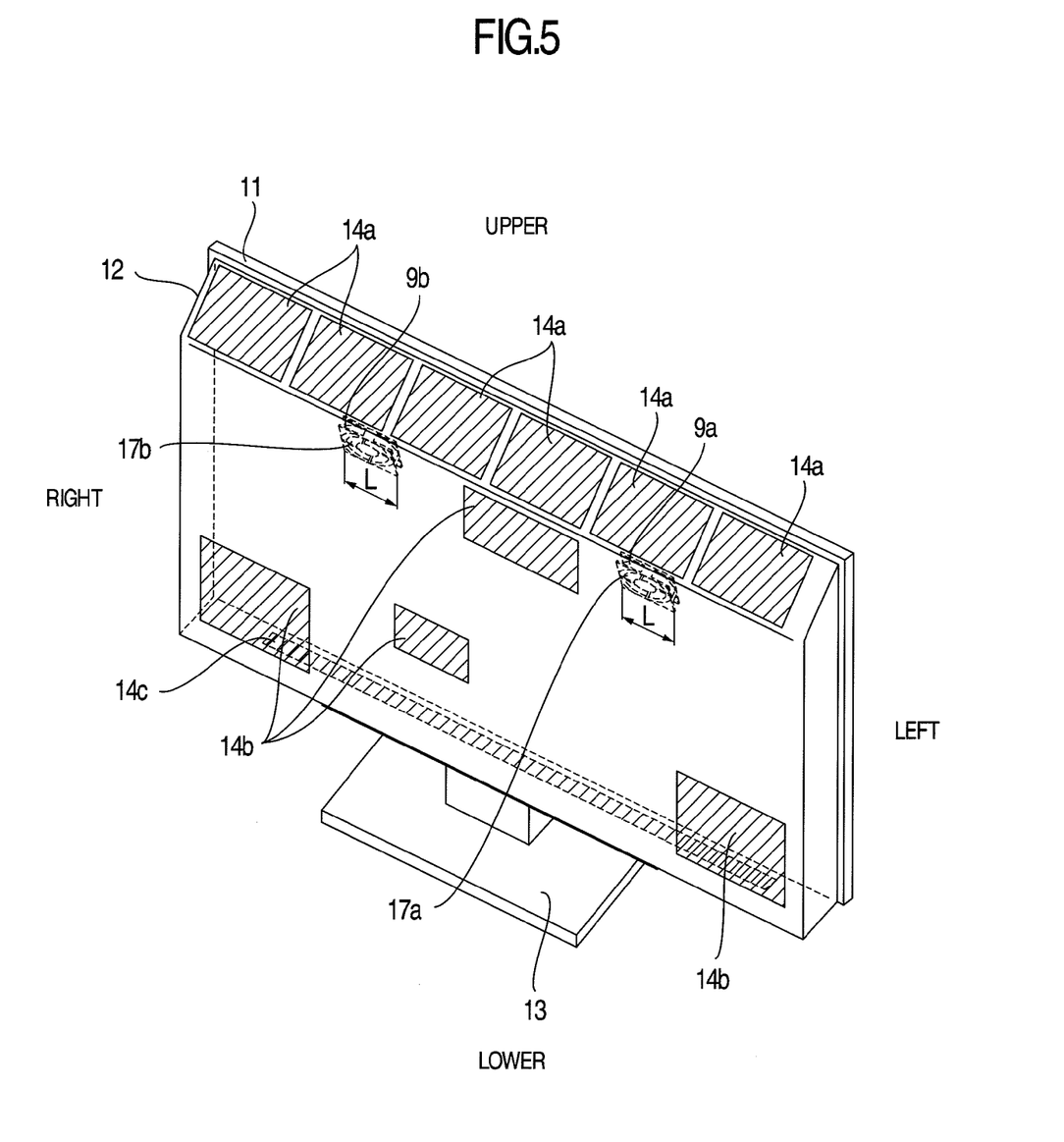
FIG. 5 is a rear perspective view of the image display as the first embodiment of the present invention.
Figure 11:
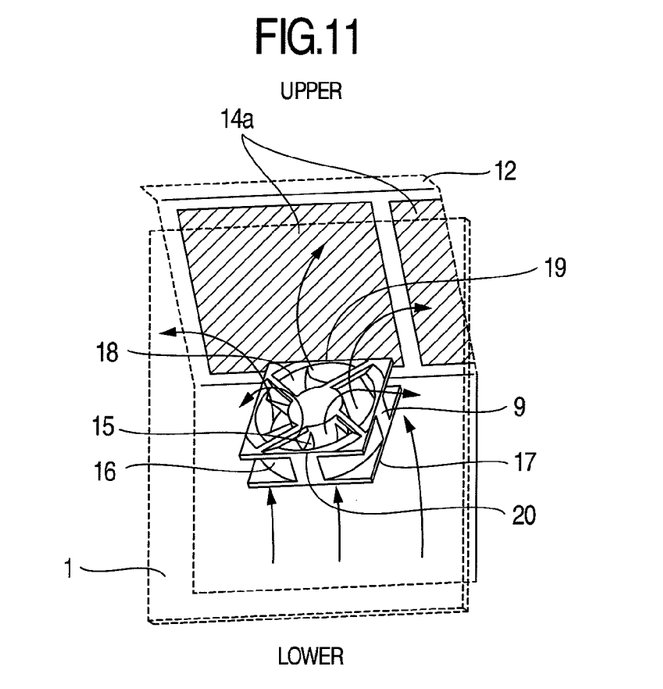
FIG. 11 is a perspective view of appearance of a display surface side of the essential part of the image display as the first embodiment of the present invention.

An embodiment of the present invention will be described below with reference to the drawings. FIG. 1 is a perspective view of appearance of a non-display surface side of an essential part of an image display as a first embodiment. FIG. 2 is a sectional view of a cross section A-A of the image display in FIG. 1 as viewed from a side surface of the image display. FIGS. 3 and 4 are sectional views of conventional structures corresponding to the cross section A-A in FIG. 1. FIG. 5 is a rear perspective view of the image display as the first embodiment of the present invention. FIG. 11 is a perspective view of appearance of a display surface side of the essential part of the image display as the first embodiment of the present invention.

In FIG. 1, reference numerals 1, 2, and 3 denote a display panel module, a flexible cable, and a fixing board, respectively. Reference numerals 4, 5, and 6 denote an image processing electronic component, an image processing electronic component on the flexible cable 2, and a connector, respectively. Reference numerals 7, 8, and 9 denote a power supply board, a control unit, and a cooling fan, respectively. Reference numerals 10, 11, and 12 denote a cooling fan, a display-surface-side cover, and a non-display-surface-side cover, respectively. Reference numerals 13, 14, and 15 denote a stand, an opening in the non-display-surface-side cover 12, and an impeller of the cooling fan, respectively. Reference numerals 16, 17, and 18 denote a case of the cooling fan, an inlet of the cooling fan, and an outlet of the cooling fan, respectively. Reference numerals 19 and 20 denote an upper end of the outlet of the cooling fan and a lower end of the outlet of the cooling fan, respectively. Reference numerals 21 and 22 denote protective glass and a display driving board, respectively.

In the image display, a surface of the display panel module 1 in FIGS. 1 and 2 on which images are displayed corresponds to a display surface (front side). A rear surface of the display panel module 1 on which the display driving board and the like are installed corresponds to a non-display surface (rear surface). For convenience of description, a lateral direction of the image display is defined as the one as viewed from the display surface side. A vertical direction of the image display is defined as the one in an installed condition. FIG. 2 shows that the protective glass 21 is installed on the display surface side of the display panel module 1. However, the protective glass 21 need not be installed.

The flexible cables 2 are provided at ends of the display panel module 1 to supply image signals and driving power. The flexible cables 2 are often provided on a right end surface, a left end surface, and a lower end surface of the display panel module 1. FIG. 1 shows that flexible cables 2a, 2b, and 2c are provided at the left end surface, the right end surface, and the lower end surface, respectively. Each of the flexible cables 2 is folded back into a U shape, and ends of the flexible cable 2 is fixed to the fixing board 3 installed on the non-display surface side of the display panel module 1. The fixing board 3 is provided for each group of flexible cables 2. A fixing board 3a is provided for the flexible cables 2a. A fixing board 3b is provided for the flexible cables 2b. A fixing board 3c is provided for the flexible cables 2c. Image signals and power are distributively transmitted to all pixels in the display panel module 1 arranged in a vertical direction and a horizontal direction. Thus, the flexible cables 2 are installed so as to cover most of the side surfaces and bottom surface of the display panel module 1. A plurality of image processing electronic components 4a, 4b, and 4c, are often provided on the flexible cable fixing boards 3a, 3b, and 3c, respectively. In particular, a plurality of the image processing electronic components 5c are often provided on the lower end surface flexible cable 2c. A display driving board 22 is connected to the right and left fixing boards 3a and 3b via connectors 6a and 6b, respectively. The display driving board 22 is generally provided for each of the fixing boards 3a and 3b. FIG. 1 shows that a display driving board 22a is provided for the fixing board 3a and that a display driving board 22b is provided for the fixing board 3b. Power and image signals are supplied to lower end-side image processing electronic components 4c and 5c via cables (not shown in the drawings). Furthermore, the housing internally houses the power supply board 7, the control unit 8, which includes an I/O terminal and a control circuit, and the cooling fans 9 and 10. FIG. 1 shows that four cooling fans, an upper left cooling fan 9a, an upper right cooling fan 9b, a lower left cooling fan 10a, and a lower right cooling fan 10b are mounted.

As shown in FIG. 1, the display panel module 1 and the components are externally surrounded by the display-surface-side cover 11 and the non-display-surface-side cover 12. The stand 13 is mounted on the covers so as to make up the housing. A plurality of openings 14 are formed in the non-display-surface-side cover 12. FIG. 1 shows that the non-display-surface-side cover 12 includes upper openings 14a, rear openings 14b, and lower openings 14c. Although the shapes of the openings are not shown in detail, the openings are composed of a perforated plate, slits, or meshes. Here, some of the upper openings 14a, the lower openings 14c, and the rear openings 14b may be omitted.

In this case, the cooling fan 9 includes the rotating impeller 15 and the fixed case 16, and further includes an inlet 17 through which air flows in and an outlet 18 through which air flows out. As shown in FIGS. 1, 2, and 11, the outlet 18 side of the case 16 includes an upper end 19 and a lower end 20. In FIG. 1, the case 16 is shaped like a rectangular. However, if the case 16 is round, the upper end 19 and the lower end 20 are defined based on an assumption that the case 16 is divided into an upper piece, a lower piece, a right piece, and a left piece each of which has an angle of 90°. In this case, the cooling fan is obliquely installed (at an angle of 30° to 60°, desirably 40° to 50° to a horizontal plane) such that the upper end 19 of the outlet 18 of the cooling fan 9 is located closer to the non-display-surface-side cover 12 than to the display panel module 1 and such that the lower end 20 of the outlet 18 of the cooling fan 9 is located closer to the display panel module 1 than to non-display-surface-side cover 12. Moreover, when the length of the case 16 of the cooling fan 9 is defined as L and the distance between a rear side of the display panel module 1 and the non-display-surface-side cover 12 at a position where the cooling fan 9 is installed is defined as D, the length L of the case 16 is larger than the distance D.

In the above-described configuration, a fan with a large diameter can be mounted which is larger than the distance D between the rear side of the display panel module 1 and the non-display-surface-side cover 12 at the position where the cooling fan 9 is installed. Thus, compared to a different cooling fan having a case length L equal to or smaller than the distance D, this configuration enables a flow rate equivalent to or greater than that achieved by the different cooling fan to be supplied even with the reduced rotation speed of the fan. Moreover, the reduced rotation speed of the fan enables a reduction in noise.

Furthermore, the outlet 18 of the cooling fan 9 faces obliquely forward and upward. Thus, a blowing jet-like flow of air is provided which is blown against the display panel module 1, a main heat generating component in the housing. This effectively improves the heat transfer rate in a ventilation area to promote cooling of the display panel module 1.

For comparison, two conventional examples of the installation structure of the cooling fan 9 are shown in FIGS. 3 and 4. In FIG. 3, the upper end 19 of the outlet of the cooling fan 9 is joined to the corresponding opening 14 in the non-display-surface-side cover over the entire end side thereof. The cooling fan 9 operates to exhaust air from the interior to exterior of the housing. A shade in the figure schematically shows a high temperature area in the housing formed by heat generated by the display panel module 1, various boards, and the like. In the vicinity of the display panel module 1, an upward flow of air is formed by both the natural convection and the ventilation by the cooling fan 9. The high-temperature air area starts to be formed at the lower end of the display panel module 1 and flows upward. The high-temperature air area spreads gradually toward the non-display-surface-side cover 12, and further spreads at the position of heat generating components such as the board 22. The heat generated by the display panel module 1 and the various boards generally increases the temperature of the internal, upper half area of the housing. However, as shown in FIG. 3, part of the flow of air formed by the cooling fan 9 often rises along the non-display-surface-side cover 12 with the temperature thereof insignificantly increased. As shown in FIG. 3, this part is further directly sucked and exhausted to the exterior of the housing by the cooling fan 9.

In another conventional structure shown in FIG. 4, the small-sized cooling fan 9 is installed so as to face upward to form an upward flow. Also in this case, part of the flow of air formed by the cooling fan 9 often rises along the non-display-surface-side cover 12 with the temperature thereof insignificantly increased. As shown in FIG. 4, this part is often sucked and exhausted to the exterior of the housing by the cooling fan 9.

In contrast, in the structure shown in FIG. 2, since the cooling fan 9 is installed so as to extend obliquely forward and upward, the flow of air rising along the non-display-surface-side cover 12 with the temperature thereof insignificantly increased can be supplied directly to the upper part of the display panel module 1, the temperature of which is disadvantageously likely to increase. This simultaneously exerts the effect of increasing the flow rate as described above and the effect of increasing a difference in temperature between the display panel module 1 and the supplied air to thus increase the amount of radiated heat. As a result, the cooling effect can synergistically be enhanced.

The vertical installation position of the cooling fan 9 is preferably above the center of the display panel module 1, shown by line B-B in FIG. 1. The temperature of the display panel module 1 is likely to increase particularly at the upper side thereof. Thus, by installing the obliquely forward and upward facing cooling fan 9 above the center of the display panel module 1, cooling air is allowed to flow reliably through the relevant area, enabling a possible increase in temperature to be inhibited. In particular, if at least one cooling fan 9b is installed above the power supply board 7 and the display driving board 22, the cooling of the display panel module 1 is effectively promoted in an area thereof above a large-sized heat generating board such as the display driving board 22b in FIG. 1.

In the non-display-surface-side cover 12, in particular, the rear opening 14b preferably avoids being formed in the vicinity of a rear side of the inlet 17 of the cooling fan 9 as shown in FIG. 5. If the opening 14b is present in the non-display-surface-side cover 12 in the vicinity of the rear side of the inlet 17 of the cooling fan 9, the cooling fan 9 sucks air intensively through the opening 14b. Consequently, dust in the air is likely to be built up in the opening 14b portion during a prolonged operation. When sucked into the housing by the cooling fan 9, the built-up dust disperses to a terminal portion in the housing. Then, a new risk of a defect such as an electric short circuit may occur. Moreover, if the opening 14b is present in the non-display-surface-side cover 12 in the vicinity of the rear side of the inlet 17 of the cooling fan 9, noise emitted through the opening 14b by the cooling fan 9 disadvantageously leaks readily to the exterior of the housing. Thus, by avoiding formation of the rear opening 14b in the vicinity of the rear side of the inlet 17 of the cooling fan 9, a reliable, low-noise image display can be provided.

Figure 6:
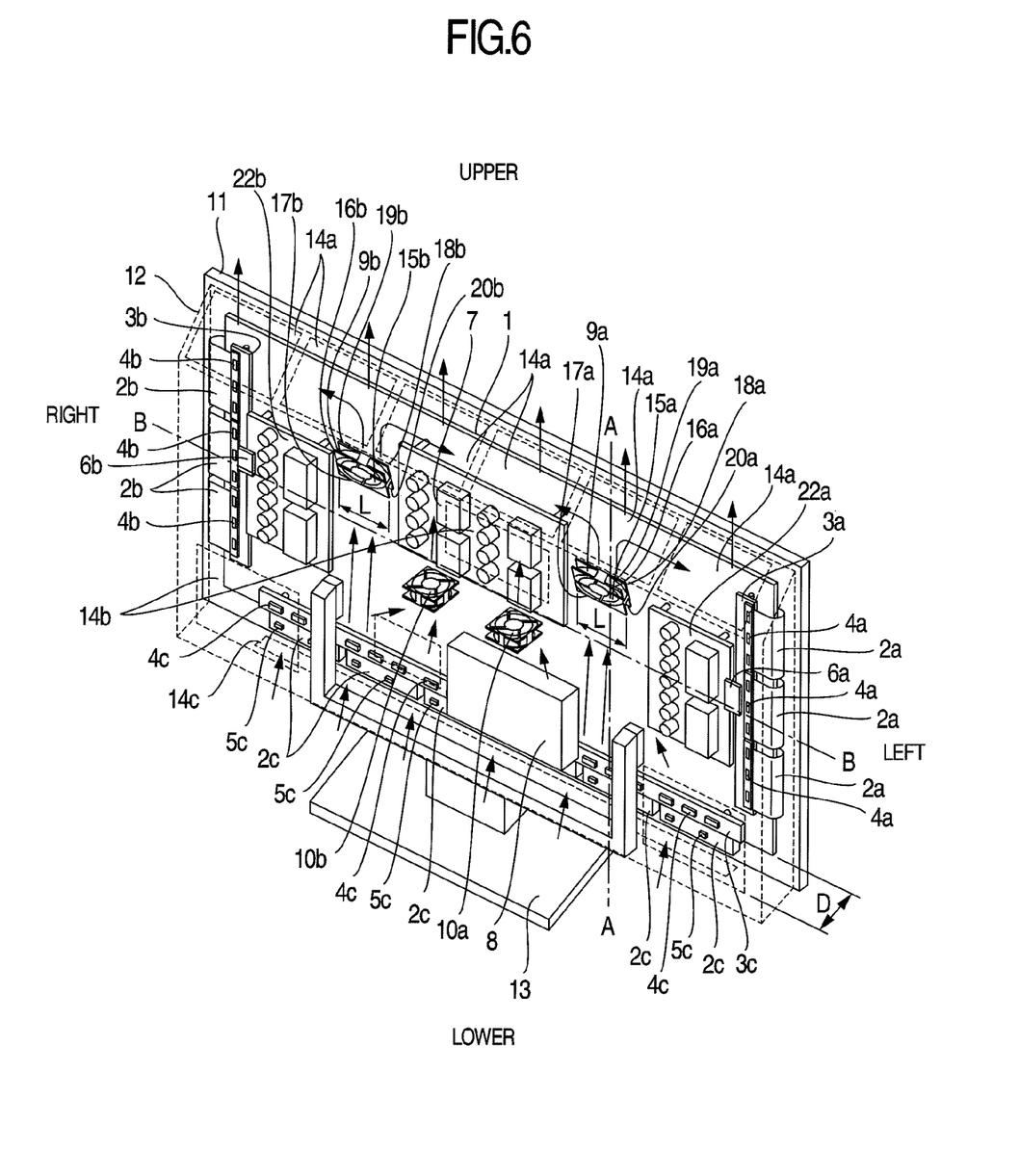
FIG. 6 is a perspective view of appearance of a non-display surface side of an essential part of an image display as a second embodiment of the present invention.
Figure 7:
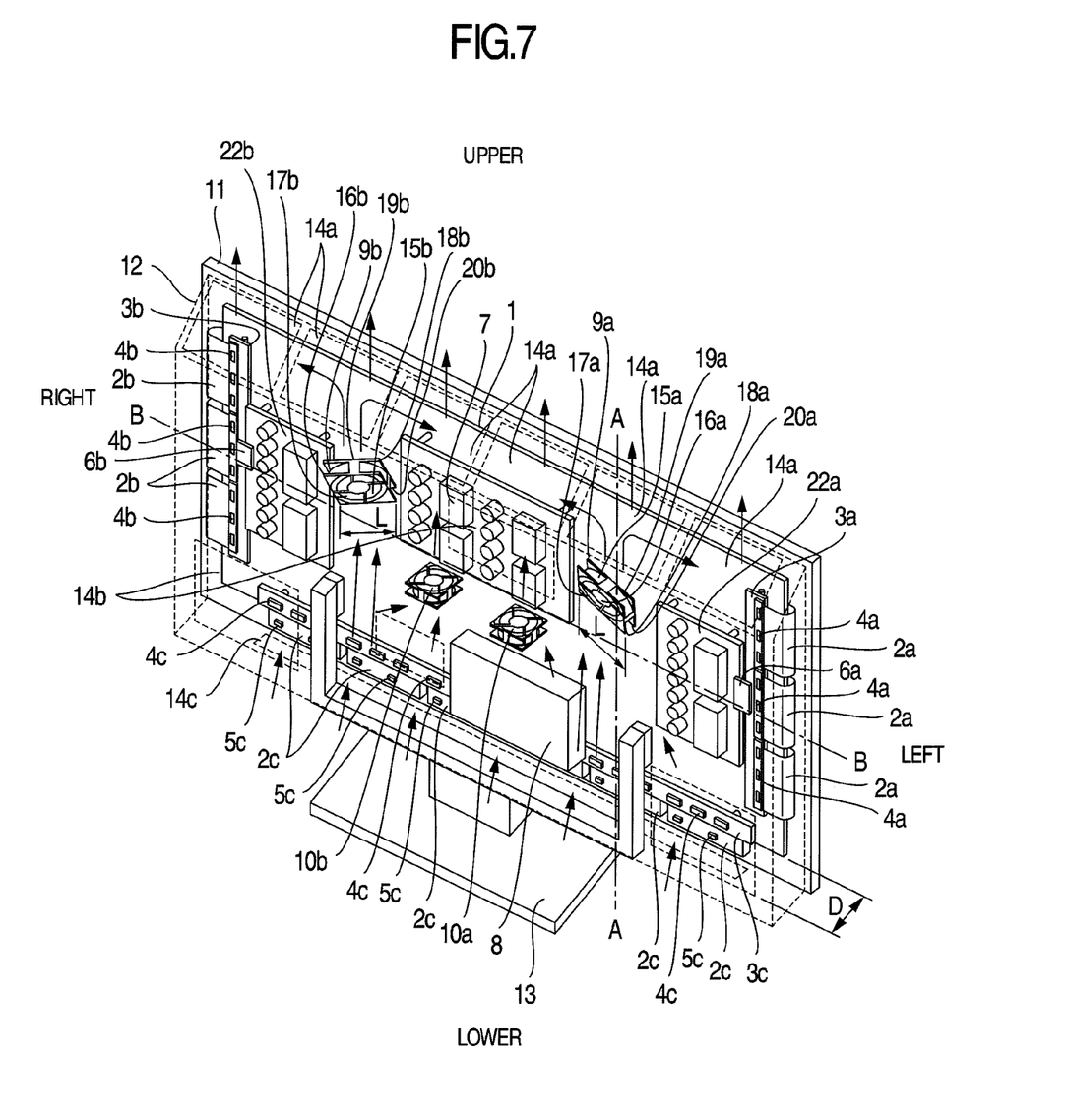
FIG. 7 is a perspective view of appearance of a non-display surface side of an essential part of another image display as the second embodiment of the present invention.

With reference to FIGS. 6 and 7, a second embodiment of the present invention will be described. FIG. 6 is a perspective view of appearance of a non-display surface side of an essential part of an image display as a second embodiment of the present invention. FIG. 7 is a perspective view of appearance of a non-display surface side of an essential part of another image display as the second embodiment of the present invention.

In the second embodiment of the present invention, the installation position of the cooling fan 9 is such that in the vertical direction, the cooling fan 9 is installed above the center of the display panel module 1, corresponding to line B-B in FIG. 6, and in the lateral direction, at least one cooling fan 9 is installed between the display driving board 22 and the power supply board 7, as shown in FIG. 6.

In a large-sized image display, there is a long distance between the display driving board 22 and the power supply board 7. Thus, the cooling fan 9 can be installed between the display driving board 22 and the power supply board 7. The display driving board 22 and the power supply board 7 are heat generating components. Thus, the air temperature is likely to increase in the vicinity of these boards. On the other hand, when the cooling fan 9 is actuated, a flow of air flows into the housing though the openings 14b and 14c and the like located on the lower side of the non-display-surface-side cover 12. The flow of air then rises between the power supply board 7 and the display driving board 22, where few obstacles are present in the vertical direction. The flow of air is thus readily sucked by the cooling fan 9. At this time, in particular, a flow of air is often formed which rises along the non-display-surface-side cover 12 with the temperature thereof kept low. However, since the cooling fan 9 is installed to extend obliquely forward and upward, the cool flow of air can be supplied to the upper, hot area of the display panel module 1, which needs to be intensively cooled. As a result, efficient cooling can be achieved.

In the embodiment shown in FIG. 6, the cooling fan 9 is installed obliquely in a front-back direction. However, as shown in FIG. 7, the cooling fan 9 may further be inclined in the lateral direction to allow cooling air from the cooling fan 9 to spread easily in the lateral direction to enlarge the area that can further be cooled.

Figure 8:
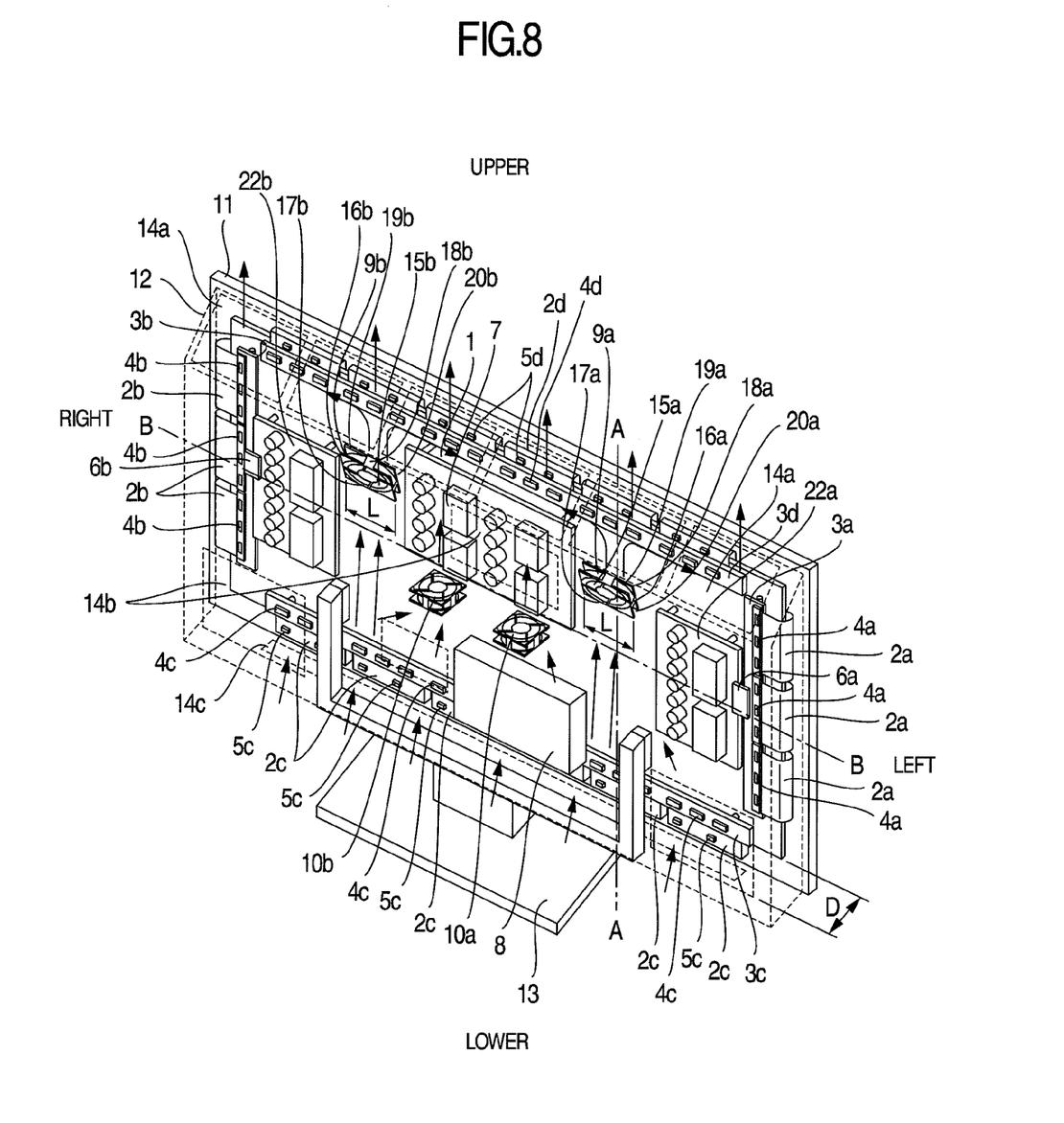
FIG. 8 is a perspective view of appearance of a non-display surface side of an essential part of an image display as a third embodiment of the present invention.
Figure 9:
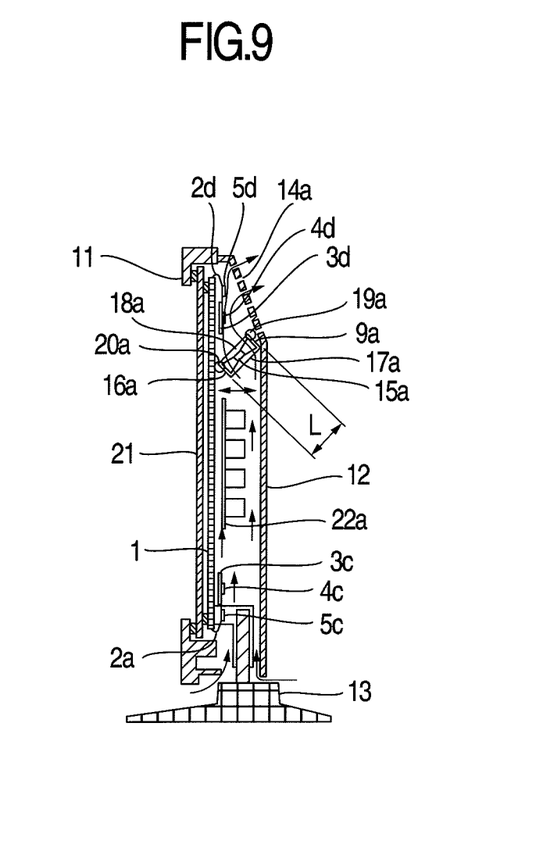
FIG. 9 is a sectional view of a cross section A-A of the image display in FIG. 8 as viewed from a side surface of the image display.
Figure 10:
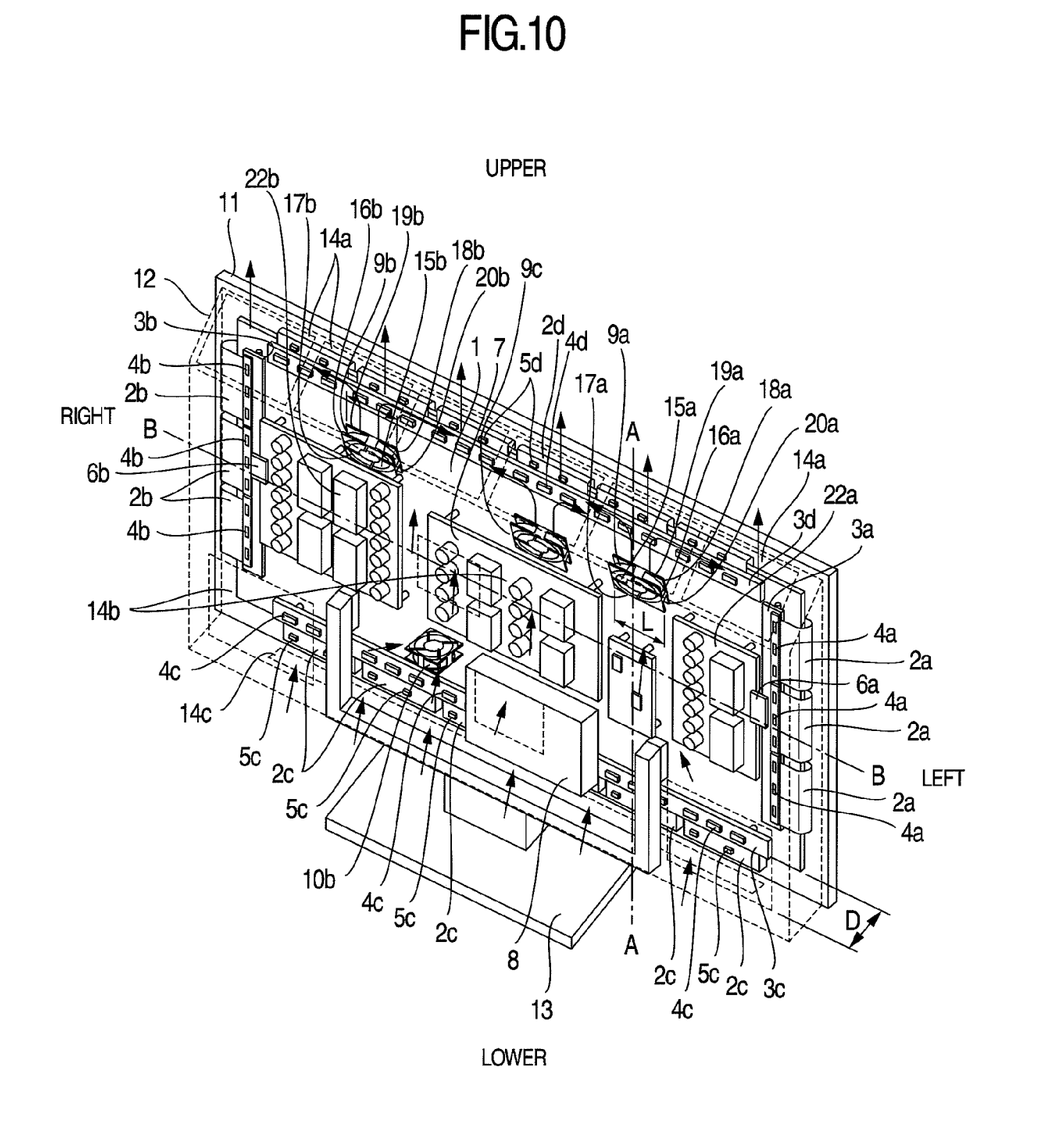
FIG. 10 is a perspective view of appearance of a non-display surface side of an essential part of an image display as the third embodiment of the present invention.

A third embodiment of the present invention will be described with reference to FIGS. 8, 9, and 10. FIG. 8 is a perspective view of appearance of a non-display surface side of an essential part of an image display as a third embodiment of the present invention. FIG. 9 is a sectional view of a cross section A-A of the image display in FIG. 8 as viewed from a side surface of the image display. FIG. 10 is a perspective view of appearance of a non-display surface side of an essential part of an image display as the third embodiment of the present invention. FIG. 9 shows that the protective glass 21 is installed on the display surface side of the display panel module 1. However, the protective glass 21 need not be installed.

In FIGS. 8 and 9, reference numeral 2d denotes a flexible cable provided at the upper end of the display panel module 1. Reference numeral 3d denotes a fixing board provided at the upper end of the display panel module 1. Reference numeral 4d denotes an image processing electronic component provided at the upper end of the display panel module 1. Reference numeral 5d denotes an image processing electronic component installed on the flexible cable 2d.

The display panel module 1 compatible with a Full-HD with a large number of pixels may have difficulty in displaying high-brightness and high-definition images simply with the flexible cables 2 and image processing electronic components 4 and 5 provided at the bottom and right and left ends of the display panel module as shown in FIG. 1. In this case, the display panel module 1 may also be supplied with image signals and the like by the image processing electronic components 4d and 5d via the flexible cables 2d; the image processing electronic components 4d and 5d and the flexible cables 2d are provided at the upper end of the display panel module 1 as shown in FIGS. 8 and 9. Image signals and power are distributively transmitted to the horizontal pixels in the display panel module 1. Thus, the flexible cables 2d are installed so as to cover most of a top surface of the display panel module 1. As shown in FIG. 8, a plurality of the image processing electronic components 4d are often provided on each of the flexible cable fixing board 3d. Moreover, a plurality of the image processing electronic components 5d are often separately provided.

However, with the conventional cooling structure shown in FIGS. 4 and 5, air with the temperature thereof increased by heat generated by the display panel module 1 and the various boards rises to the vicinity of the upper end of the display panel module 1. The air temperature in the vicinity of the upper end of the display panel 1 is high, making the cooling of the image processing electronic components 4d and 5d, heat generating components, difficult.

Here, as shown in FIGS. 8 and 9, the cooling fan 9 is obliquely installed such that the upper end 19 of the outlet 18 of the cooling fan 9 is located closer to the non-display-surface-side cover 12 than to the display panel module 1 and such that lower end 20 of the outlet 18 of the cooling fan 9 is located closer to the display panel module 1 than to the non-display-surface-side cover 12. Moreover, when the length of the case 16 of the cooling fan 9 is defined as L and the distance between the rear side of the display panel module 1 and the non-display-surface-side cover 12 at the position where the cooling fan 9 is installed is defined as D, the length L of the case 16 is larger than the distance D.

In the above-described configuration, the outlet 18 of the cooling fan 9 faces obliquely forward and upward. Thus, a blowing jet-like flow of air is supplied to the display panel module 1, a main heat generating component in the housing, and the image processing electronic components 4d and 5d, which are difficult to cool because of an increase in surrounding air temperature. This effectively improves the heat transfer rate in the ventilation area to promote cooling of the display panel module 1 and the image processing electronic components 4d and 5d. In the structures shown in FIGS. 8 and 9, since the cooling fan 9 is installed so as to extend obliquely forward and upward, the flow of air rising along the non-display-surface-side cover 12 with the temperature thereof insignificantly increased can be supplied directly to the upper part of the display panel module 1 and the image processing electronic components 4d and 5d, the temperature of which is disadvantageously likely to increase. This simultaneously exerts the effect of increasing the flow rate as described above and the effect of increasing the difference in temperature between the supplied air and the display panel module 1 and the image processing electronic components 4d and 5d to thus increase the amount of radiated heat. As a result, the cooling effect can synergistically be enhanced.

Moreover, in the above-described configuration, a fan with a large diameter can be mounted which is larger than the distance D between the rear side of the display panel module 1 and the non-display-surface-side cover 12 at the position where the cooling fan 9 is installed. Thus, compared to a different cooling fan having a case length L equal to or smaller than the distance D, this configuration enables a flow rate equivalent to or greater than that achieved by the different cooling fan to be supplied even with the reduced rotation speed of the fan. Moreover, the reduced rotation speed of the fan enables a reduction in noise.

The preferable installation position of the cooling fan 9 is such that in the vertical direction, the cooling fan 9 is installed above the center of the display panel module 1, corresponding to line B-B in FIG. 8, and in the lateral direction, at least one cooling fan 9 is installed between the display driving board 22 and the power supply board 7. The temperature of the display panel module 1 is likely to increase particularly at the upper side thereof, and the image processing electronic components 4d and 5d are positioned at the upper end of the display panel module 1. Thus, by installing the obliquely forward and upward facing cooling fan 9 above the center of the display panel module 1, cooling air is allowed to flow reliably through the relevant areas, enabling a possible increase in temperature to be inhibited.

Furthermore, for the lateral direction, if at least one cooling fan 9 is installed between the display driving board 22 and the power supply board 7, when the cooling fan 9 is actuated, a flow of air flows into the housing though the openings 14b and 14c and the like located on the lower side of the non-display-surface-side cover 12. The flow of air then rises between the power supply board 7 and the display driving board 22, where few obstacles are present in the vertical direction. The flow of air is thus readily sucked by the cooling fan 9. At this time, in particular, a flow of air is often formed which rises along the non-display-surface-side cover 12 with the temperature thereof kept low. However, since the cooling fan 9 is installed to extend obliquely forward and upward, the cool flow of air can be supplied to the upper, hot area of the display panel module 1, which needs to be intensively cooled. As a result, efficient cooling can be achieved.

Alternatively, as shown in FIG. 10, at least one cooling fan 9b may be installed above the power supply board 7 and the display driving board 22. In this configuration, the cooling fan 9 is located closer to the image processing electronic components 4d and 5d to allow cooling air from the cooling fan 9 to be supplied more directly to the image processing electronic components 4d and 5d. Thus, the cooling of the image processing electronic components 4d and 5d is effectively promoted.

In the non-display-surface-side cover 12, in particular, the rear opening 14b is preferably not formed in the vicinity of the rear side of the inlet 17 of the cooling fan 9 as shown in FIG. 5 for Embodiment 1. If the opening 14b is present in the non-display-surface-side cover 12 in the vicinity of the rear side of the inlet 17 of the cooling fan 9, the cooling fan 9 sucks air intensively through the opening 14b. Consequently, dust in the air is likely to be built up in the opening 14b portion during a prolonged operation. When sucked into the housing by the cooling fan 9, the built-up dust disperses to the terminal portion in the housing. Then, a new risk of a defect such as an electric short circuit may occur. Moreover, if the opening 14b is present in the non-display-surface-side cover 12 in the vicinity of the rear side of the inlet 17 of the cooling fan 9, noise emitted through the opening 14b by the cooling fan 9 disadvantageously leaks readily to the exterior of the housing. Thus, by avoiding formation of the rear opening 14b in the vicinity of the rear side of the inlet 17 of the cooling fan 9, a reliable, low-noise image display realizing high-brightness and high-definition images can be provided.

Figure 12:
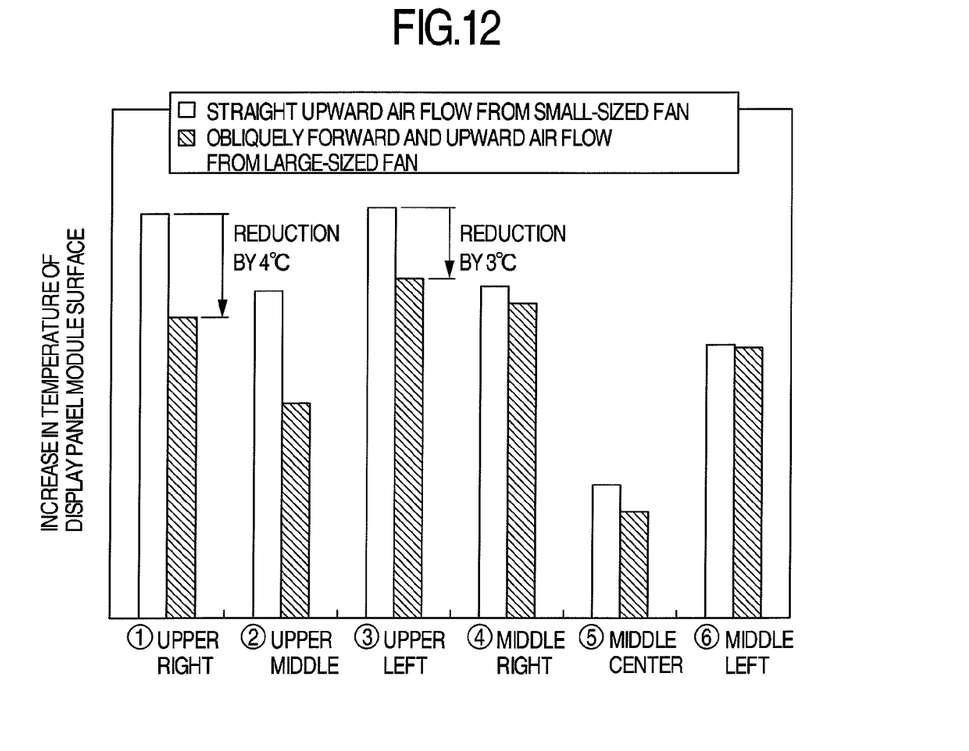
FIG. 12 is a diagram showing a temperature reduction effect exerted by the third embodiment of the present invention.
Figure 13:
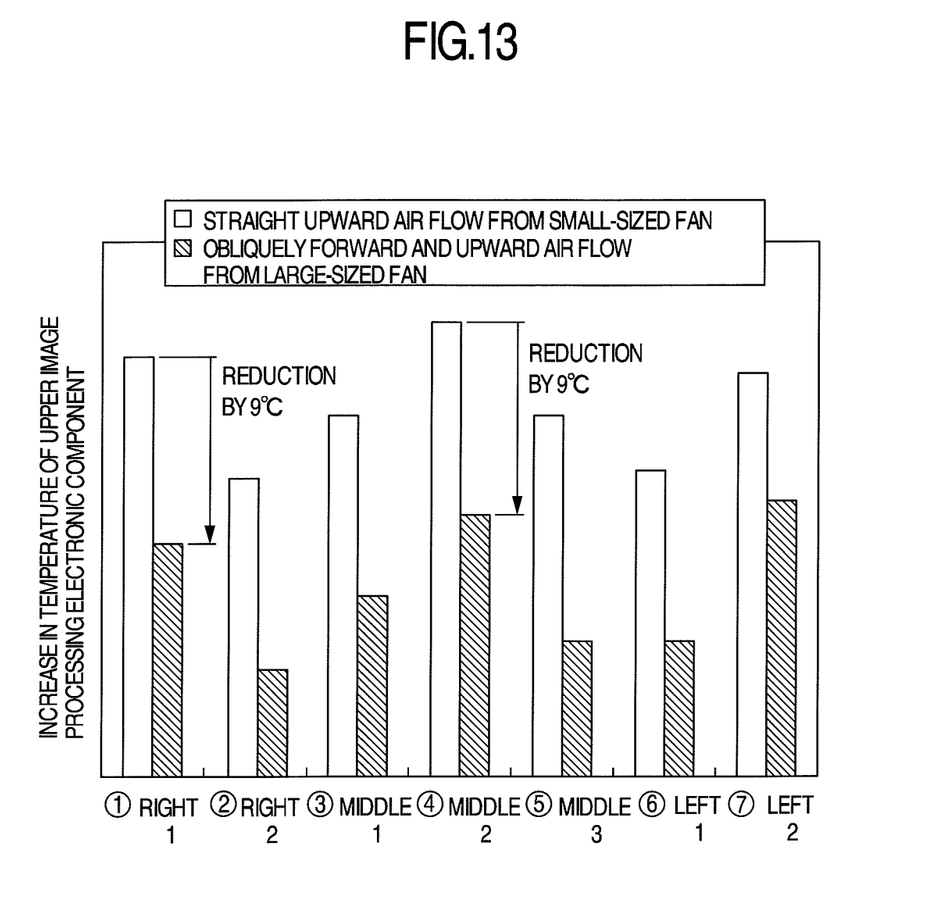
FIG. 13 is a diagram showing the temperature reduction effect exerted by the third embodiment of the present invention.

FIG. 12 shows an increase in the temperature of the display panel module 1 above room temperature, and FIG. 13 shows an increase in the temperature of the image processing electronic component 5d at the upper end of the display panel module 1, above the room temperature; in FIGS. 12 and 13, a straight upward air flow from a small-sized fan, corresponding to the conventional structure shown in FIG. 4 is compared with an obliquely forward and upward air flow from the large-sized fan shown in FIG. 8. For the display panel module 1, the results of measurement of the temperature at six points are shown; three of the six points correspond to the left, center, and right of the upper stage portion, and the remaining three correspond to the left, center, and right of the middle stage portion. For the image processing electronic component 5d, the results of measurement of the temperatures of seven components arranged from right to left are shown. FIG. 12 shows that the obliquely forward and upward air flow from the large-sized fan enables a reduction in the maximum temperature of a surface of the display panel module by 3° C. and a reduction in the temperature of another portion by 4° C. FIG. 13 shows that the obliquely forward and upward air flow from the large-sized fan enables a reduction in the temperature of the image processing electronic component 5d by 9° C. These temperature reduction values indicate a significant effect in improving the reliability of the image display.

The structures of the embodiments including Embodiments 1 and 2 have been described with reference to the diagrams substantially showing examples of the structure of a plasma display. However, the present invention is not necessarily intended only for the plasma display. The present invention is also applicable to other large-sized flat panel displays such as a liquid crystal display and an organic EL display which need to provide high-brightness and high-definition images using a reliable, low-noise cooling structure.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An image display comprising a panel display module of flat type, an image display surface side cover arranged at an image display surface side of the panel display module, a non image display surface side cover arranged at an non image display surface side of the panel display module opposite to the image display surface side in a thickness direction of the panel display module, a display drive substrate, an electric power source substrate, and at least one cooling fan, wherein the at least one cooling fan has a rotating impeller and a case receiving therein the rotating impeller, a size of the case in a first direction perpendicular to a rotational axis of the rotating impeller being greater than a distance in a second direction perpendicular to a surface of the panel display module at the non image display surface side between the surface of the panel display module at the non image display surface side and the non image display surface side cover at a position where the at least one cooling fan is arranged, in a cross sectional view taken along a vertical imaginary plane perpendicular to the surface of the panel display module at the non image display surface side, and wherein the at least one cooling fan is arranged so that one end of the exhaust side surface is closer to the panel display module than the non image display surface side cover while another end of the exhaust side surface is closer to the non image display surface side cover than the panel display module, and the another end of the case which is closer to the non image display surface side cover and opposite to the end of the case in the first direction, is arranged at an upper position with respect to the one end of the case which is closer to the panel display module, in the cross sectional view, so that an air flowing out of the at least one cooling fan is directed toward the panel display module.

2. The image display according to claim 1, wherein the at least one cooling fan is arranged at an upper position with respect to the display drive substrate and the electric power source substrate.

3. The image display according to claim 1, wherein the at least one cooling fan is arranged at an upper position with respect to a vertically half position of the panel display module between the display drive substrate and the electric power source substrate.

4. The image display according to claim 1, wherein a plurality of image processing electronic parts are arranged in the vicinity of an upper end of the panel display module.

5. The image display according to claim 1, wherein the non image display surface side cover has an opening prevented from being arranged at a rear side of an inlet of the cooling fan.

* * * * *